United States Patent
Park et al.

(10) Patent No.: US 10,128,126 B2
(45) Date of Patent: Nov. 13, 2018

(54) METHOD OF DOPING 2-DIMENSIONAL SEMICONDUCTOR

(71) Applicant: RESEARCH & BUSINESS FOUNDATION SUNGKYUNKWAN UNIVERSITY, Suwon-si (KR)

(72) Inventors: Jin Hong Park, Yongin-si (KR); Hyung Youl Park, Gimpo-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 15/339,892

(22) Filed: Oct. 31, 2016

(65) Prior Publication Data

US 2017/0125263 A1    May 4, 2017

(30) Foreign Application Priority Data

Oct. 30, 2015    (KR) .................. 10-2015-0151713

(51) Int. Cl.
| | |
|---|---|
| *H01L 21/385* | (2006.01) |
| *H01L 21/02* | (2006.01) |
| *H01L 21/477* | (2006.01) |

(52) U.S. Cl.
CPC ........ *H01L 21/385* (2013.01); *H01L 21/0259* (2013.01); *H01L 21/02568* (2013.01); *H01L 21/477* (2013.01)

(58) Field of Classification Search
None
See application file for complete search history.

(56) References Cited

U.S. PATENT DOCUMENTS

| | | | |
|---|---|---|---|
| 2014/0166972 A1 | 6/2014 | Greeley et al. | |
| 2016/0365255 A1* | 12/2016 | Sharma | H01L 21/477 |
| 2017/0141194 A1* | 5/2017 | Shah | H01L 29/267 |
| 2018/0004082 A1* | 1/2018 | Song | G03F 1/22 |

FOREIGN PATENT DOCUMENTS

| | | |
|---|---|---|
| KR | 10-2006-0042349 A | 5/2006 |
| KR | 10-1275282 B1 | 6/2013 |

OTHER PUBLICATIONS

Hyung-Youl Park, et al., "Wide-Range Controllable n-Doping of Molybdenum Disulfide ($MoS_2$) through Thermal and Optical Activation," *ACSNANO*, vol. 9, No. 3, Feb. 18, 2015, pp. 2368-2376.

* cited by examiner

*Primary Examiner* — Evren Seven
(74) *Attorney, Agent, or Firm* — NSIP Law

(57) ABSTRACT

The present disclosure relates to a method of doping a 2-dimensional semiconductor. The method of doping a 2-dimensional semiconductor includes: forming an insulating layer including photosensitive particles on a substrate; moving the photosensitive particles included in the insulating layer to a surface of the insulating layer through a heat treatment; forming a 2-dimensional semiconductor layer on the insulating layer; and doping a 2-dimensional semiconductor material included in the 2-dimensional semiconductor layer by exposing the 2-dimensional semiconductor material to a light corresponding to an absorption wavelength of the photosensitive particles included in the insulating layer.

8 Claims, 7 Drawing Sheets

METHOD OF DOPING 2-DIMENSIONAL SEMICONDUCTOR

CROSS-REFERENCE TO RELATED APPLICATION

This application claims the benefit under 35 USC 119(a) of Korean Patent Application No. 10-2015-0151713 filed on Oct. 30, 2015, in the Korean Intellectual Property Office, the entire disclosures of which are incorporated herein by reference for all purposes.

TECHNICAL FIELD

The present disclosure relates to a method of doping a 2-dimensional semiconductor.

BACKGROUND 2-dimensional semiconductors have excellent electrical, mechanical, and optical properties and thus are drawing a lot of attention as next-generation semiconductor materials which can be applied to flexible devices and transparent devices. A semiconductor integrated circuit based on a 2-dimensional semiconductor material requires a p-type semiconductor as well as an n-type semiconductor.

Examples of conventional methods of n-type or p-type doping of a 2-dimensional semiconductor material include a method of inducing polarization using a chemical material, a method of moving an electron or hole to a 2-dimensional semiconductor material by coating a material with a high charge carrier mobility on the 2-dimensional semiconductor material, and a method of injecting impurities during the growth of a 2-dimensional semiconductor material.

However, if a 2-dimensional semiconductor material is doped by the above-described doping methods, it is impossible to selectively dope the 2-dimensional semiconductor material, and, thus, it is difficult to apply these doping methods to a semiconductor integrated circuit. Further, according to a method of doping a 2-dimensional semiconductor material using a chemical material, a reaction with the chemical material may cause damage to a substrate. Thus, it is impossible to apply this method to a flexible electronic device or the like.

In this regard, US Patent Laid-open Publication No. 20140166972 (entitled "Methods of self-aligned growth of chalcogenide memory access device") discloses a method of doping a chalcogenide material formed on an insulating layer using a photodoping process.

SUMMARY

In view of the foregoing, some exemplary embodiments of the present disclosure provide a method of selectively doping a 2-dimensional semiconductor material.

Further, some exemplary embodiments of the present disclosure provide a method of doping a 2-dimensional semiconductor material which can be applied to a semiconductor integrated circuit and a flexible electronic device.

However, problems to be solved by the present disclosure are not limited to the above-described problems. There may be other problems to be solved by the present disclosure.

According to an exemplary embodiment of the present disclosure, a method of doping a 2-dimensional semiconductor includes: forming an insulating layer including photosensitive particles on a substrate; moving the photosensitive particles included in the insulating layer to a surface of the insulating layer through a heat treatment; forming a 2-dimensional semiconductor layer on the insulating layer; and doping a 2-dimensional semiconductor material included in the 2-dimensional semiconductor layer by exposing the 2-dimensional semiconductor material to a light corresponding to an absorption wavelength of the photosensitive particles included in the insulating layer.

According to another exemplary embodiment of the present disclosure, a method of doping a 2-dimensional semiconductor includes: forming a 2-dimensional semiconductor layer on a substrate; forming a photosensitive particle layer by coating an aqueous solution including photosensitive particles on the semiconductor layer; and doping a 2-dimensional semiconductor material included in the 2-dimensional semiconductor layer by exposing the 2-dimensional semiconductor material to a light corresponding to an absorption wavelength of the photosensitive particles included in the photosensitive particle layer.

According to the above-described exemplary embodiments of the present disclosure, in an example suggested in the present disclosure, it is possible to selectively dope a 2-dimensional semiconductor material through optical activation in a thermally and chemically stable manner.

Further, it is possible to control and optimize the performance of a semiconductor integrated circuit and a flexible electronic device by doping a 2-dimensional semiconductor material.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
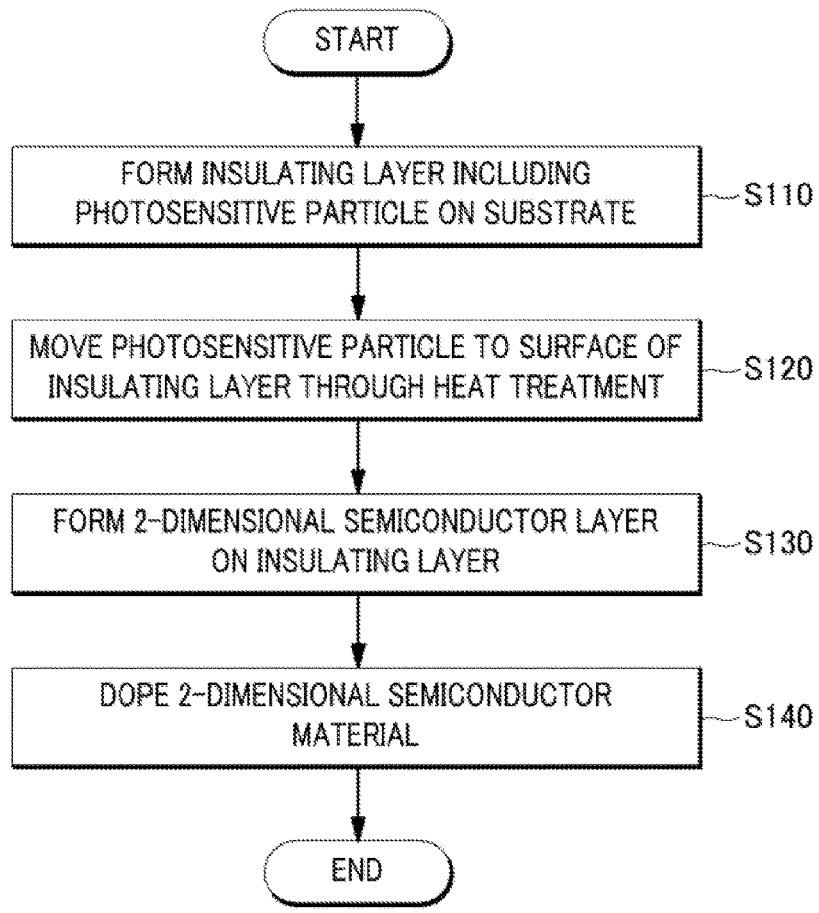
FIG. 1 is a flowchart provided to explain a method of doping a 2-dimensional semiconductor in accordance with an exemplary embodiment of the present disclosure.

Hereinafter, embodiments of the present disclosure will be described in detail with reference to the accompanying drawings so that the present disclosure may be readily implemented by those skilled in the art. However, it is to be noted that the present disclosure is not limited to the embodiments but can be embodied in various other ways. In drawings, parts irrelevant to the description are omitted for the simplicity of explanation, and like reference numerals denote like parts through the whole document.

Through the whole document, the term "connected to" or "coupled to" that is used to designate a connection or coupling of one element to another element includes both a case that an element is "directly connected or coupled to" another element and a case that an element is "electronically connected or coupled to" another element via still another element. Further, the term "comprises or includes" and/or "comprising or including" used in the document means that one or more other components, steps, operation and/or existence or addition of elements are not excluded in addition to the described components, steps, operation and/or elements unless context dictates otherwise.

Hereinafter, a method of doping a 2-dimensional semiconductor in accordance with an exemplary embodiment of the present disclosure will be described in detail with reference to the accompanying drawings.

In an exemplary embodiment of the present disclosure, a 2-dimensional semiconductor refers to a semiconductor having a predetermined area with a thickness of several nm.

FIG. 1 is a flowchart provided to explain a method of doping a 2-dimensional semiconductor in accordance with an exemplary embodiment of the present disclosure.

FIGS. 2A through 2E schematically illustrate the method of doping a 2-dimensional semiconductor in accordance with an exemplary embodiment of the present disclosure.

Referring to FIG. 1, a method of doping a 2-dimensional semiconductor in accordance with an exemplary embodiment of the present disclosure includes: forming an insulating layer including photosensitive particles on a substrate (S110); moving the photosensitive particles to a surface of the insulating layer through a heat treatment (S120); forming a 2-dimensional semiconductor layer on the insulating layer (S130); and doping a 2-dimensional semiconductor material (S140).

Figure 2A:
FIGS. 2A through 2E schematically illustrate the method of doping a 2-dimensional semiconductor in accordance with an exemplary embodiment of the present disclosure.

In the method of doping a 2-dimensional semiconductor in accordance with an exemplary embodiment of the present disclosure, a substrate 100 may be prepared as illustrated in FIG. 2A. In this case, the substrate 100 is a substrate generally used for a semiconductor device, and may use glass, quart, silicon (Si), germanium (Ge), and the like. Further, a flexible plastic substrate including polyethylene phthalate (PET), polyethylene naphthalate (PEN), polyethyleneimine (PEI), or the like may be used. The substrate 100 is not limited to any one material.

Figure 2B:
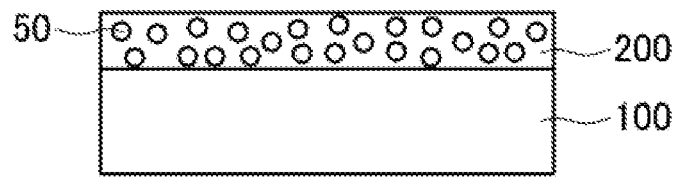

Then, referring to FIG. 1 and FIG. 2B, an insulating layer 200 including photosensitive particles 50 may be formed on the substrate 100 (S110). Herein, an example of the insulating layer 200 including the photosensitive particles 50 may be a phosphorous-injected insulating film (phosphosilicate glass (PSG)), but is not limited thereto. Further, the insulating layer 200 including the photosensitive particles 50 may be formed to a thickness of from about 30 nm to about 300 nm, but is not limited thereto.

Meanwhile, the insulating layer 200 including the photosensitive particles 50 may be formed by any one of deposition methods including chemical vapor deposition (CVD), plasma enhanced CVD (PECVD), low pressure CVD (LVCVD), physical vapor deposition (PVD), sputtering, or atomic layer deposition (ALD).

Otherwise, the insulating layer 200 including the photosensitive particles 50 may be formed by synthesizing the photosensitive particles 50 when an insulating layer is grown on the substrate by a thermal oxidation method generally used in a semiconductor process. Herein, the photosensitive particle 50 is a material sensitive to light and may be a photoinduced electron transfer (PET) material that absorbs a photon and transfers an electron. For example, the photosensitive particle may include any one or more of cadmium selenide (CdSe), titanium oxide ($TiO_2$) and ruthenium compounds, but is not limited thereto.

Figure 2C:
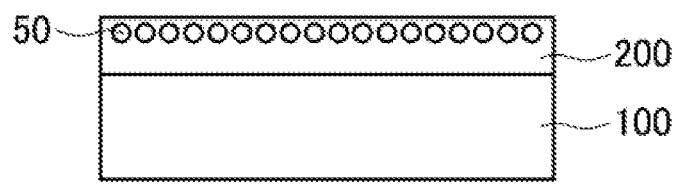

Then, referring to FIG. 2C, in the moving of the photosensitive particles to a surface of the insulating layer (S120), the photosensitive particles 50 can be moved to the surface of the insulating layer through a heat treatment. For example, the substrate on which the insulating layer including the photosensitive particles 50 is formed may be placed in a furnace in a nitrogen atmosphere and then heated at about 700° C. to about 900° C. for 1 hour. Through this heat treatment, the photosensitive particles 50 included in the insulating layer 200 can be spread and moved to the surface of the insulating layer 200.

Figure 2D:
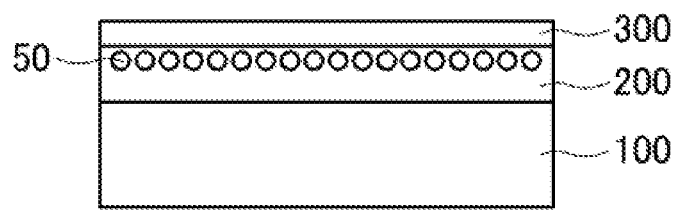

Then, as illustrated in FIG. 2D, a 2-dimensional semiconductor layer 300 is formed on the insulating layer 200 including the photosensitive particles heat-treated in S120 (S130). The 2-dimensional semiconductor layer 300 on the insulating layer 200 may be formed by performing any one of a peeling process of peeling a preform of a 2-dimensional semiconductor material using a tape and then forming the 2-dimensional semiconductor layer 300 on the insulating layer 200 or a transfer process using a polymer, but is not limited thereto. Specifically, in the transfer process using the polymer, a 2-dimensional semiconductor material may be grown to a large area on a substrate by chemical vapor deposition (CVD) and a polymer (generally, PMMA) may be coated on the 2-dimensional semiconductor material and then the substrate is etched to separate only the polymer-coated 2-dimensional semiconductor material, and the 2-dimensional semiconductor material is floated on deionized water to be transferred to the insulating layer 200. In this case, the 2-dimensional semiconductor material may include any one of graphene, transition metal dichalcogenide, or black phosphorous, but is not limited thereto.

Figure 2E:
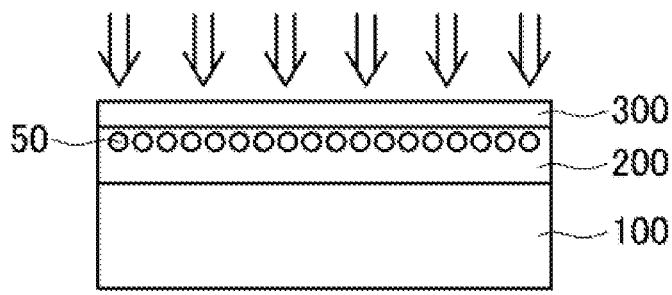

Finally, as illustrated in FIG. 2E, in the doping of the 2-dimensional semiconductor material (S140), the substrate on which the 2-dimensional semiconductor layer 300 is formed may be exposed to a light having an intensity of from 100 nW to 1 mW for about several seconds to about several minutes. Through S140, a phase of the photosensitive particles included in the insulating layer 200 is changed, and the phase-changed photosensitive particles 50 induce an oxidation or reduction reaction. That is, the photosensitive particles 50 transfer charges to the 2-dimensional semiconductor material through an oxidation or reduction reaction caused by light. In other words, the 2-dimensional semiconductor material included in the 2-dimensional semiconductor layer 300 can be doped through optical activation of the photosensitive particles 50 included in the insulating layer 200.

In this case, the light used for exposure is a light having a wavelength corresponding to an absorption wavelength of the photosensitive particles, and may be any one of an ultraviolet light, a visible light, an infrared light, but is not limited to a specific wavelength range. That is, a wavelength and an intensity of the light for exposure may vary depending on a concentration and the kind of the photosensitive particles, and a design process, but is not limited any one of them.

Meanwhile, the method of doping a 2-dimensional semiconductor in accordance with an exemplary embodiment of the present disclosure may further include an annealing process prior to the doping of the 2-dimensional semiconductor material (S140). In this case, an annealing temperature may be about 500° C., but is not limited thereto. In accordance with an exemplary embodiment of the present disclosure, an interface between the insulating layer 200 and the 2-dimensional semiconductor material of the 2-dimensional semiconductor layer 300 can be improved and the photosensitive particles 50 can be thermally activated through the annealing process.

Figure 3:
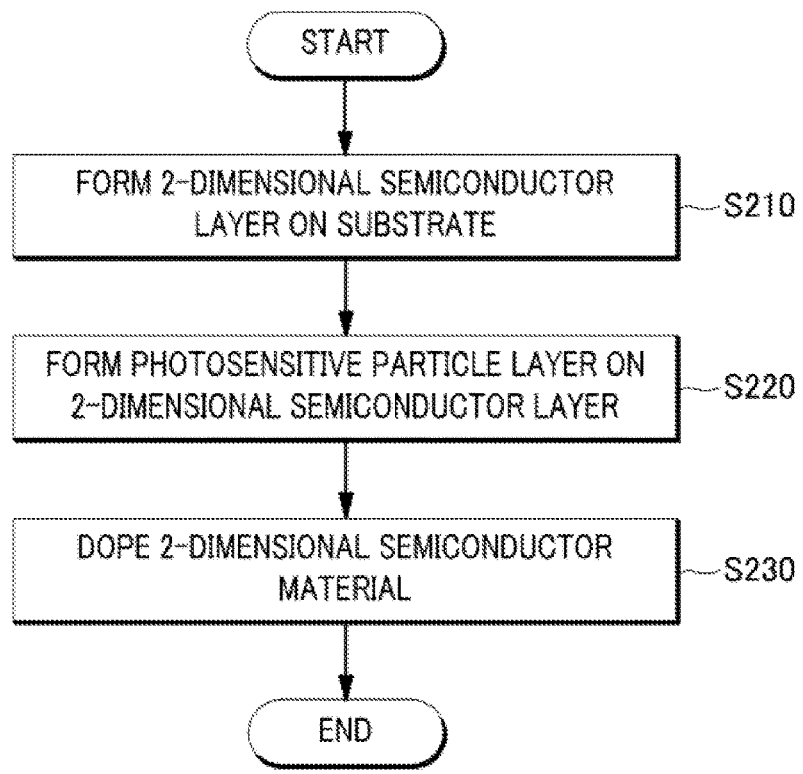
FIG. 3 is a flowchart provided to explain a method of doping a 2-dimensional semiconductor in accordance with another exemplary embodiment of the present disclosure.

FIG. 3 is a flowchart provided to explain a method of doping a 2-dimensional semiconductor in accordance with another exemplary embodiment of the present disclosure.

FIGS. 4A through 4E schematically illustrate the method of doping a 2-dimensional semiconductor in accordance with another exemplary embodiment of the present disclosure.

Referring to FIG. 3, a method of doping a 2-dimensional semiconductor in accordance with another exemplary embodiment of the present disclosure includes: forming a 2-dimensional semiconductor layer on a substrate (S210); forming a photosensitive particle layer on the 2-dimensional semiconductor layer (S220); and doping a 2-dimensional semiconductor material (S230).

Figure 4A:
FIGS. 4A through 4E schematically illustrate the method of doping a 2-dimensional semiconductor in accordance with another exemplary embodiment of the present disclosure.

Likewise, in the method of doping a 2-dimensional semiconductor in accordance with another exemplary embodiment of the present disclosure, the substrate 100 may be prepared as illustrated in FIG. 4A. In this case, the substrate 100 is a substrate generally used for a semiconductor device, and may use glass, quart, silicon (Si), germanium (Ge), and the like. Further, a flexible plastic substrate including polyethylene phthalate (PET), polyethylene naphthalate (PEN), polyethyleneimine (PEI), or the like may be used as the substrate 100. The substrate 100 is not limited to any one material.

Figure 4B:
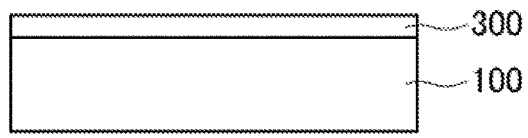

Then, referring to FIG. 3 and FIG. 4B, the 2-dimensional semiconductor layer 300 may be formed by performing any one of a peeling process using a tape or a transfer process using a polymer to form a 2-dimensional semiconductor material on the substrate 100, but is not limited thereto. Herein, the 2-dimensional semiconductor material may include any one of graphene, transition metal dichalcogenide, or black phosphorous, but is not limited thereto.

Figure 4C:
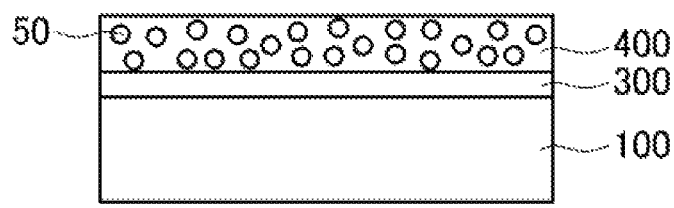
Figure 4D:
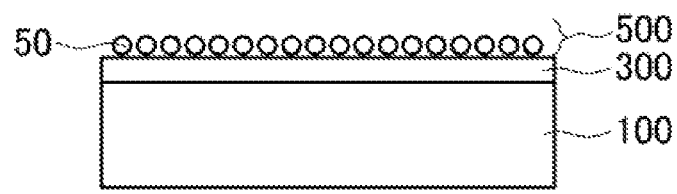

Then, referring to FIG. 4C and FIG. 4D, in the forming of a photosensitive particle layer on the 2-dimensional semiconductor layer (S220), a photosensitive particle layer 500 may be formed by coating an aqueous solution 400 including the photosensitive particles 50 (FIG. 4C) and evaporating water included in the aqueous solution 400 (FIG. 4D).

Specifically, the aqueous solution 400 including the photosensitive particles 50 may be coated on the 2-dimensional semiconductor layer 300 by performing any one of screen printing, dip coating, stamping, and spin coating (FIG. 4C). Herein, the photosensitive particle 50 is a material sensitive to light and may be a photoinduced electron transfer (PET) material that absorbs a photon and transfers an electron. For example, the photosensitive particle 50 may include any one or more of cadmium selenide (CdSe), titanium oxide ($TiO_2$) and ruthenium compounds, but is not limited thereto.

Then, the water included in the aqueous solution 400 coated on the 2-dimensional semiconductor layer 300 is evaporated, leaving only the photosensitive particles 50, so that the photosensitive particle layer 500 may be formed (FIG. 4D). Herein, the water included in the aqueous solution 400 including the photosensitive particles 50 may be evaporated by any one of a near infrared heating method, an infrared heating method, a room temperature drying method, or a drying oven heating method, but is not limited thereto.

Figure 4E:
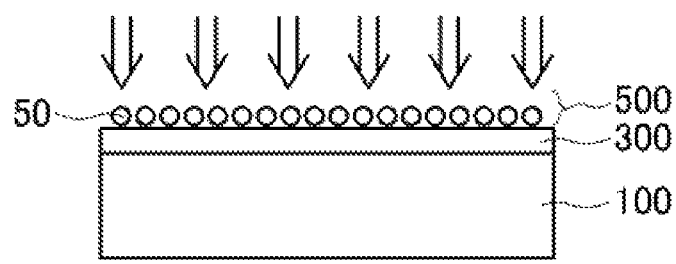

Finally, referring to FIG. 4E, in the doping of a 2-dimensional semiconductor material (S230), the substrate on which the photosensitive particle layer 500 is formed on the 2-dimensional semiconductor layer 300 may be exposed to a light having an intensity of from 100 nW to 1 mW for about several seconds to about several minutes 100 nW.

Through the light exposure performed in S230, a phase of the photosensitive particles included in the photosensitive particle layer 500 is changed, and the phase-changed photosensitive particles 50 induce an oxidation or reduction reaction. That is, the photosensitive particles 50 transfer charges to the 2-dimensional semiconductor material through an oxidation or reduction reaction caused by light. In other words, the 2-dimensional semiconductor material can be doped through optical activation of the photosensitive particles 50 included in the photosensitive particle layer 500.

In this case, the light used for exposure is a light having a wavelength corresponding to an absorption wavelength of the photosensitive particles, and may be any one of an ultraviolet light, a visible light, an infrared light, but is not limited to a specific wavelength range. That is, a wavelength and an intensity of the light for exposure may vary depending on a concentration and the kind of the photosensitive particles, and a design process, but is not limited any one of them.

EXAMPLE 1

An insulating layer including photosensitive particles was formed on a substrate using a chemical vapor deposition method. Specifically, an insulating material including phosphorus pentoxide ($P_2O_5$) (phosphosilicate glass (PSG)) was formed as the insulating layer including the photosensitive particles and then heat-treated at about 700° C. Then, a 2-dimensional semiconductor layer was formed using molybdenum disulfide ($MoS_2$). After thermal activation through an annealing process at about 500° C., the 2-dimensional semiconductor layer was exposed to a light having a wavelength of 655 nm, and, thus, the molybdenum disulfide included in the 2-dimensional semiconductor layer was doped through optical activation. Specifically, the phosphorus pentoxide ($P_2O_5$) was negatively charged and thus combined with a hole present in the 2-dimensional semiconductor layer through optical activation using light. Therefore, electrons seemed to be relatively increased. That is, n-type doping occurred, and a doping concentration can be adjusted by adjusting the amount of molecule of phosphorus pentoxide distributed on a surface of the insulating layer and a distance from the 2-dimensional semiconductor material.

Figure 5:
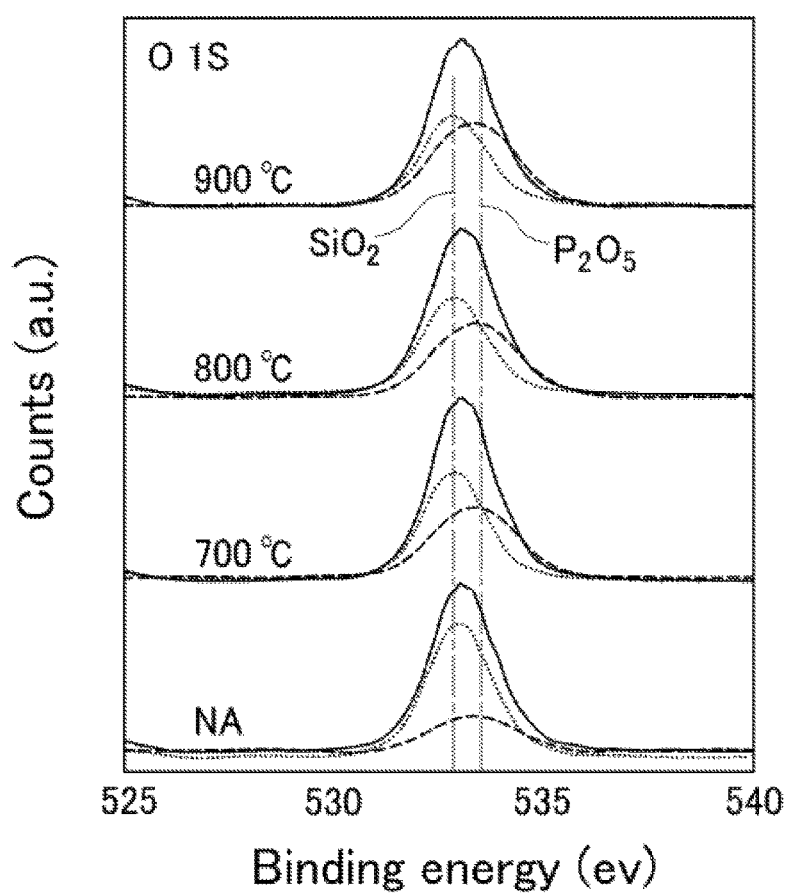
FIG. 5 is a graph showing the result of an X-ray photoelectron spectroscopy on a 2-dimensional semiconductor material doped by varying a temperature of a heat treatment in accordance with an exemplary embodiment of the present disclosure.

FIG. 5 is a graph showing the result of an X-ray photoelectron spectroscopy on a 2-dimensional semiconductor material doped by varying a temperature of a heat treatment in accordance with an exemplary embodiment of the present disclosure.

Referring to FIG. 5, the X-ray photoelectron spectroscopy (XPS) confirmed that the amount of phosphorus pentoxide molecule on the surface of the insulating layer was adjusted depending on a heating temperature during the heat treatment, and also confirmed that as the heating temperature increased, the amount of phosphorus pentoxide molecule on the surface of the insulating layer increased.

Figure 6A:
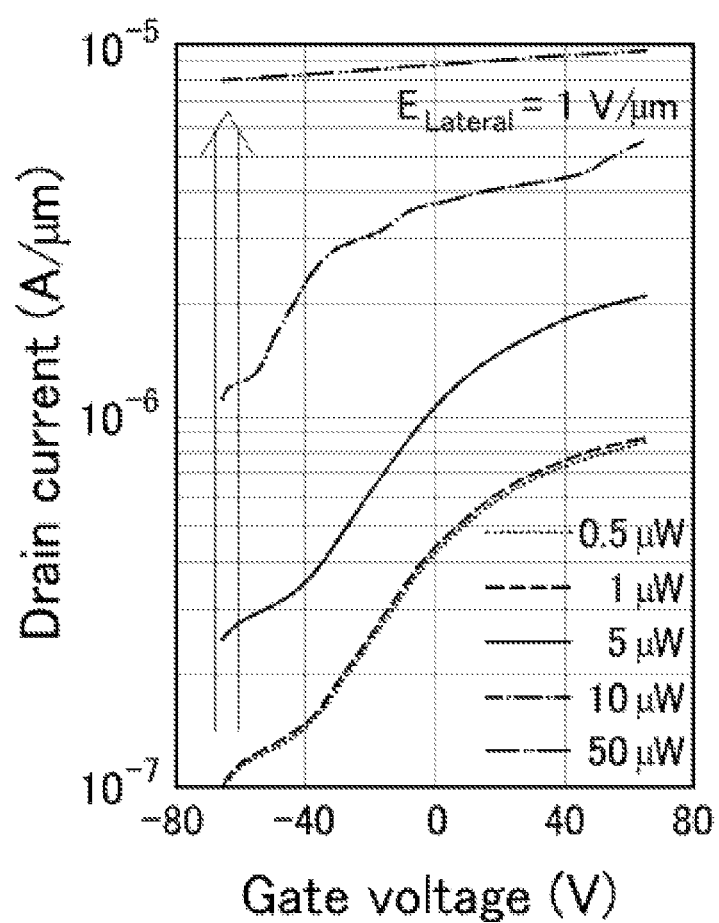
FIGS. 6A and 6B are a graph showing the result of a drain current analysis on a 2-dimensional semiconductor material doped by varying an intensity of an exposure light in accordance with an exemplary embodiment of the present disclosure.
Figure 6B:
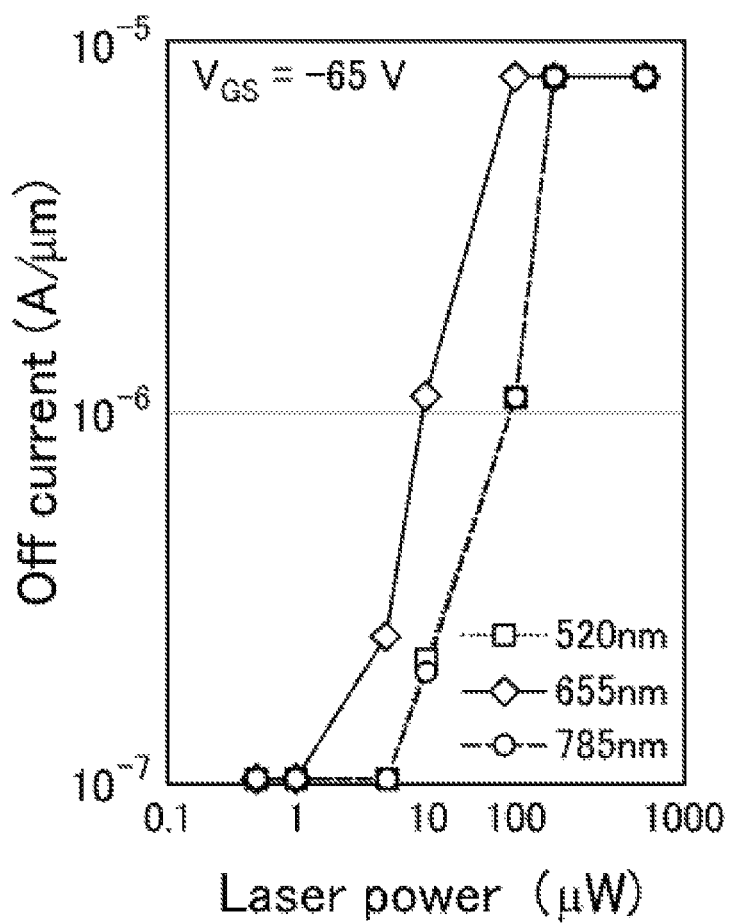

FIGS. 6A and 6B are a graph showing the result of a drain current analysis on a 2-dimensional semiconductor material doped by varying an intensity of an exposure light in accordance with an exemplary embodiment of the present disclosure.

For reference, FIGS. 6A and 6B show a measurement result obtained by performing optical activation using a laser on an electronic device and then removing the laser in order to check doping caused by optical activation to the exclusion of a photocurrent effect using a light.

Referring to FIG. 6A, it can be seen that an off-current is increased at 1 μW or more and as an intensity of the laser is increased, a doping degree is increased. Further, as illustrated in FIG. 6B, it can be seen that when a wavelength of the laser is changed, a doping degree is changed depending on an intensity of the laser.

As described above, according to the method of doping a 2-dimensional semiconductor in accordance with an exemplary embodiment of the present disclosure, it is possible to selectively dope a 2-dimensional semiconductor material through optical activation in a thermally and chemically stable manner. Further, it is possible to control and optimize the performance of a semiconductor integrated circuit and a flexible electronic device by doping a 2-dimensional semiconductor material.

The above description of the present disclosure is provided for the purpose of illustration, and it would be understood by those skilled in the art that various changes and modifications may be made without changing technical conception and essential features of the present disclosure. Thus, it is clear that the above-described embodiments are illustrative in all aspects and do not limit the present disclosure.

The scope of the present disclosure is defined by the following claims rather than by the detailed description of the embodiment. It shall be understood that all modifications and embodiments conceived from the meaning and scope of the claims and their equivalents are included in the scope of the present disclosure.

EXPLANATION OF CODES

50: Photosensitive particle
100: Substrate
200: Insulating layer including photosensitive particles
300: 2-dimensional semiconductor layer
400: Aqueous solution including photosensitive particles
500: Photosensitive particle layer

We claim:

1. A method of doping a 2-dimensional semiconductor, comprising:
   forming an insulating layer including photosensitive particles on a substrate;
   moving the photosensitive particles included in the insulating layer to a surface of the insulating layer through a heat treatment;
   forming a 2-dimensional semiconductor layer on the insulating layer; and
   doping a 2-dimensional semiconductor material included in the 2-dimensional semiconductor layer by exposing the 2-dimensional semiconductor material to a light corresponding to an absorption wavelength of the photosensitive particles included in the insulating layer.

2. The method of doping a 2-dimensional semiconductor of claim 1, further comprising:
   annealing the substrate on which the insulating layer including the photosensitive particles and the 2-dimensional semiconductor layer are formed prior to the doping of a 2-dimensional semiconductor material.

3. The method of doping a 2-dimensional semiconductor of claim 1,
   wherein the doping of a 2-dimensional semiconductor material includes:
   transferring charges to the 2-dimensional semiconductor material through an oxidation or reduction reaction of the photosensitive particles of which a phase is changed by the exposure to the light.

4. The method of doping a 2-dimensional semiconductor of claim 1,
   wherein the photosensitive particle is a photoinduced electron transfer (PET) material that absorbs a photon and transfers an electron.

5. The method of doping a 2-dimensional semiconductor of claim 4,
   wherein the photosensitive particle includes any one or more of cadmium selenide (CdSe), titanium oxide ($TiO_2$) and ruthenium compounds.

6. The method of doping a 2-dimensional semiconductor of claim 1,
   wherein the 2-dimensional semiconductor material includes any one of transition metal dichalcogenides.

7. The method of doping a 2-dimensional semiconductor of claim 1,
   wherein the insulating layer including the photosensitive particles includes silicon dioxide ($SiO_2$) including phosphorus pentoxide ($P_2O_5$).

8. A 2-diemensional semiconductor doped by a method of claim 1.

* * * * *